(12) United States Patent
Sawada

(10) Patent No.: US 9,869,022 B2
(45) Date of Patent: Jan. 16, 2018

(54) SUBSTRATE PROCESSING APPARATUS

(71) Applicant: HITACHI KOKUSAI ELECTRIC INC., Tokyo (JP)

(72) Inventor: Motoshi Sawada, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 326 days.

(21) Appl. No.: 14/672,795

(22) Filed: Mar. 30, 2015

(65) Prior Publication Data

US 2016/0002787 A1    Jan. 7, 2016

(30) Foreign Application Priority Data

Jul. 4, 2014  (JP) ................................. 2014-138719

(51) Int. Cl.
C23C 16/455 (2006.01)
C23C 16/44 (2006.01)
C23C 16/52 (2006.01)

(52) U.S. Cl.
CPC .... *C23C 16/45565* (2013.01); *C23C 16/4412* (2013.01); *C23C 16/45544* (2013.01); *C23C 16/45587* (2013.01); *C23C 16/52* (2013.01)

(58) Field of Classification Search
CPC ........ C23C 16/45565; C23C 16/45587; C23C 16/45544; C23C 16/4412; C23C 16/52

USPC ........... 118/715; 156/345.29, 345.33, 345.34
See application file for complete search history.

(56) References Cited

U.S. PATENT DOCUMENTS

| 5,648,276 A | 7/1997 | Hara et al. |
| 2002/0002948 A1 | 1/2002 | Hongo et al. |
| 2005/0229848 A1* | 10/2005 | Shinriki .................. C23C 16/34 118/715 |
| 2011/0162580 A1 | 7/2011 | Provencher et al. |
| 2014/0335287 A1* | 11/2014 | Nagai ................. H01J 37/3244 427/569 |

FOREIGN PATENT DOCUMENTS

| JP | 07-099321 A | 4/1995 |
| JP | 2001-274151 A | 10/2001 |
| JP | 2004-197207 A | 7/2004 |
| JP | 2005-303292 A | 10/2005 |
| JP | 2009-019500 A | 1/2009 |
| JP | 2009-524244 A | 6/2009 |

* cited by examiner

*Primary Examiner* — Rudy Zervigon
(74) *Attorney, Agent, or Firm* — Volpe and Koenig, P.C.

(57) ABSTRACT

A substrate processing apparatus includes a shower head configured to disperse a gas; a process vessel installed at a downstream side of the shower head and configured to have a process space that allows a substrate to be processed by a process gas therein; a gas supplier connected to the shower head; a shower head gas exhauster connected to the shower head; and a capturing assembly configured to capture a component different from the process gas within the shower head.

7 Claims, 7 Drawing Sheets

SUBSTRATE PROCESSING APPARATUS

CROSS-REFERENCE TO RELATED APPLICATION

This application is based upon and claims the benefit of priority from Japanese Patent Application No. 2014-138719, filed on Jul. 4, 2014, the entire contents of which are incorporated herein by reference.

TECHNICAL FIELD

The present disclosure relates to a substrate processing apparatus.

BACKGROUND

Recently, semiconductor devices such as a flash memory tend to be highly integrated. Accordingly, a pattern size has been significantly miniaturized. When forming such patterns, as one process of manufacture, a predetermined processing of oxidizing or nitriding on a substrate may be performed.

As a method of forming the patterns, there is a process of forming a groove between circuits and forming a seed film, a liner film or a wiring therein. This type of groove is configured to have a high aspect ratio, according to a recent miniaturization trend.

When forming the liner film and the like, it is required to form the film with a good step coverage, which has no variation in a film thickness and a film quality in an upper side surface, in a middle side surface, in a lower side surface, and in a bottom part of the groove. By forming the film with a good step coverage, it is possible to make properties of semiconductor devices in each groove uniform, thereby suppressing variations in the properties of semiconductor devices.

As a hardware structure approach for making the properties of semiconductor devices uniform, for example, there is a shower head structure of a single-wafer type apparatus, having gas dispersion holes formed above a substrate so that the gas is uniformly supplied.

Further, as a substrate processing method to make the properties of semiconductor devices uniform, for example, there is an alternate gas supply method in which at least two types of process gases are alternately supplied so that the processes gases react on a surface of a substrate. In the alternate gas supply method, in order to suppress respective gases from reacting in parts other than the substrate surface, remaining gases are removed by a purge gas while respective gases are supplied.

To further improve film properties, it may be considered to use the alternate gas supply method in an apparatus that employs the shower head structure. In this case, it may be considered to provide a respective buffer space or a respective gas supply path for each gas to prevent the mixture of the gases. However, in such a case, since the structure is complicated, a lot of care is required for maintenance and cost increases as well. Accordingly, it is practical to use a showerhead where supply systems of two types of gases and a purge gas are integrated into one buffer space.

However, when using the shower head including the common buffer space for two types of gases, the remaining gases may react with each other in the shower head so that adhered matters are deposited on an inner wall of the shower head. In order to avoid such a case, it is preferable to form an exhaust hole in the buffer chamber, through which atmosphere is exhausted such that the remaining gases in the buffer chamber are efficiently removed.

When using the shower head including the common buffer space for two types of gases, the apparatus is configured so that the two types of gases and the purge gas to be supplied to a process space are not diffused in a direction to the exhaust hole for exhausting the buffer space. For this configuration, for example, a gas guide configured to form a flow of gas is installed in the buffer chamber. It is preferable that the gas guide is, for example, provided between the exhaust hole for exhausting the buffer space and a supply hole configured to supply the two types of gases and the purge gas, and is installed radially toward a dispersion plate of the shower head.

In the case of the shower head having such complicated structure as discussed above, a gas may be collected or stagnant between components due to a problem of processing precision of components or a complexity of a components layout. Thus, byproducts or the like may adhere to corresponding portions. It is difficult for a cleaning gas to reach those portions where a gas is collected so that byproducts may remain thereon. Thus, it may be considered to disassemble the apparatus and then immerse the shower head in a cleaning solution or the like so as to be cleaned.

After cleaning the shower head, it is required to reduce, among residual components such as the cleaning solution, a different component from the process gas as much as possible, when assembling the apparatus again. This is because, the component different from the process gas may negatively affect subsequent processes. In general, before assembling the apparatus, such different component is removed through a baking process that requires time consumption so that a considerable down time may be consumed. Meanwhile, in order to more reliably remove the different component, a method of evacuating air with a pump or the like after assembling may be used. However, it is difficult to remove such component with a turbo molecular pump for vacuumization as an existing pump that is installed in a semiconductor manufacturing apparatus due to a structural problem. Further, a dry pump is not appropriate to remove the different component from the foregoing shower head structure because of its small exhaust power. As described above, it is required to capture the component different from the process gas within the shower head because this component is likely to negatively affect film characteristics.

SUMMARY

Some embodiments of the present disclosure provide a substrate processing apparatus which have a high efficiency of capturing a component different from a process gas within a shower head.

According to one aspect of the present disclosure, there is provided a mechanism, comprising: a shower head configured to disperse a gas; a process vessel installed at a downstream side of the shower head and configured to have a process space that allows a substrate to be processed by a process gas therein; a gas supplier connected to the shower head; a shower head gas exhauster connected to the shower head; and a capturing assembly configured to capture a component different from the process gas within the shower head.

DETAILED DESCRIPTION

Figure 1:
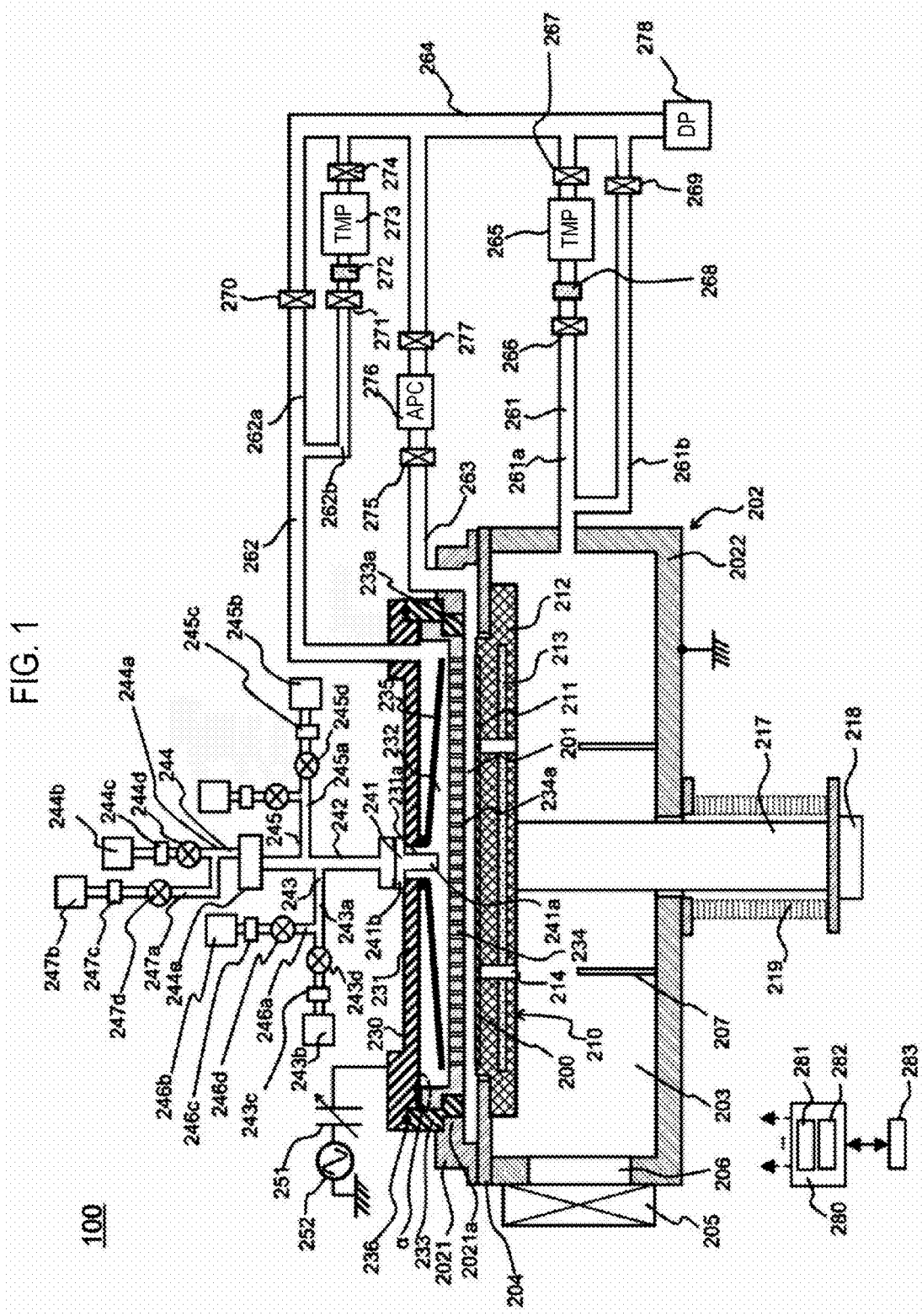
FIG. 1 is a view illustrating a substrate processing apparatus according to a first embodiment of the present disclosure.

Hereinafter, the first embodiment of the present disclosure will be described.
<Apparatus Configuration>
The configuration of a substrate processing apparatus 100 according to this embodiment is shown in FIG. 1. The substrate processing apparatus 100 is, as shown in FIG. 1, configured as a single-wafer type substrate processing apparatus.
(Process Vessel)
As shown in FIG. 1, the substrate processing apparatus 100 is provided with a process vessel 202. The process vessel 202 is configured, for example, as a flat airtight vessel having a circular cross section. In addition, the process vessel 202 may be made, for example, of metal, such as aluminum (Al) or stainless steel (SUS). A process space 201, in which a wafer 200 such as a silicon wafer as a substrate is processed, and a transfer space 203, through which the wafer 200 passes when the wafer 200 is transferred to the process space 201, are formed in the process vessel 202. The process vessel 202 may be configured with an upper vessel 2021 and a lower vessel 2022. A partition plate 204 is installed between the upper vessel 2021 and the lower vessel 2022.

A substrate loading/unloading port 206 adjacent to a gate valve 205 is installed in a side surface of the lower vessel 2022. The wafer 200 may move into and out of a transfer chamber (not shown) through the substrate loading/unloading port 206. A plurality of lift pins 207 are installed in a bottom portion of the lower vessel 2022. In addition, the lower vessel 2022 is connected to a ground.

A substrate support 210 supporting the wafer 200 is installed in the process space 201. The substrate support 210 mainly includes a mounting surface 211 having the wafer 200 mounted thereon, a substrate mounting stand 212 having the mounting surface 211 on a surface thereof, and a heater 213 as a heating source contained in the substrate mounting stand 212. Through holes 214 that are to be penetrated by the lift pins 207 are formed in the substrate mounting stand 212 at positions corresponding to the lift pins 207, respectively.

The substrate mounting stand 212 is supported by a shaft 217. The shaft 217 penetrates through a bottom portion of the process vessel 202 and is also connected to an elevating instrument 218 outside the process vessel 202. By operating the elevating instrument 218 to raise up or lower down the shaft 217 and the substrate mounting stand 212, the wafer 200 mounted on the substrate mounting surface 211 can be raised up or lowered down. In addition, a periphery of a lower end of the shaft 217 is covered with a bellows 219, thereby maintaining the interior of the process vessel 202 to be airtight.

When the wafer 200 is transferred, the substrate mounting stand 212 is lowered down such that the substrate mounting surface 211 is located at a position facing the substrate loading/unloading port 206 (wafer transfer position). When the wafer 200 is processed, the substrate mounting stand 212 is raised up such that the wafer 200 is located at a processing position (wafer processing position) in the process space 201 as shown in FIG. 1.

Specifically, when the substrate mounting stand 212 is lowered down to the wafer transfer position, upper ends of the lift pins 207 protrude from an upper surface of the substrate mounting surface 211 so that the lift pins 207 support the wafer 200 from below. In addition, when the substrate mounting stand 212 is raised up to the wafer processing position, the lift pins 207 are sunken from the upper surface of the substrate mounting surface 211 so that the substrate mounting surface 211 supports the wafer 200 from below. Further, since the lift pins 207 may be in direct contact with the wafer 200, they are preferably formed, for example, of quartz, alumina or the like.

A shower head 230 as a dispersion mechanism configured to disperse a gas is installed in an upper portion (upstream side) of the process space 201. A first dispersion mechanism 241 is installed on a lid 231 of the shower head 230, and a gas supply system described later is connected to the corresponding first dispersion mechanism 241. A gas supplied from the first dispersion mechanism 241 is supplied to the buffer space 232 of the shower head 230.

A shower head 230 as a gas dispersion mechanism may be installed at an upper portion (upstream side) of the process space 201. A through hole 231a, through which a first dispersion mechanism 241 is inserted, is formed in a lid 231 of the shower head 230. The first dispersion mechanism 241 includes a front end portion 241a that is inserted into the shower head and a flange 241b that is secured to the lid 231.

Figure 2:
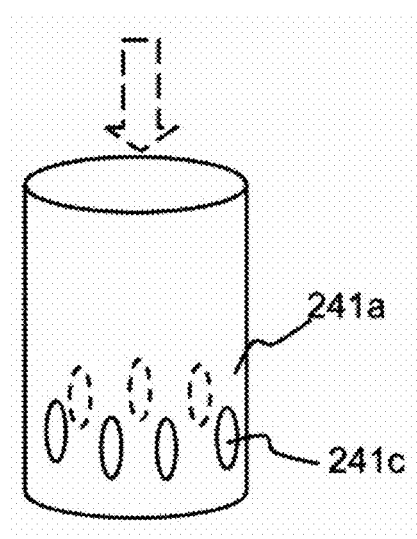
FIG. 2 is an explanatory view of a first dispersion mechanism according to the first embodiment.

FIG. 2 is an explanatory view explaining the front end portion 241a of the first dispersion mechanism 241. The front end portion 241a is configured to have a cylinder shape. Dispersion holes 241c are formed on a side surface of the cylinder. A gas supplied from a gas supplier (supply system), which is described later, is supplied to a buffer space 232 through the front end portion 241a and the dispersion holes 241c.

The lid 231 of the shower head 230 may be formed of a conductive metal and used as an electrode for generating plasma in the buffer space 232 or the process space 201. An insulation block 233 may be installed between the lid 231 and the upper vessel 2021 to insulate the lid 231 and the upper vessel 2021 from each other.

The shower head 230 may include a dispersion plate 234 as a second dispersion mechanism for dispersing gases supplied from the supply system through the first dispersion mechanism 241. The buffer space 232 is at the upstream side of this dispersion plate 234, and the process space 201 is at its downstream side. A plurality of through holes 234a may be formed in the dispersion plate 234. The dispersion plate 234 may be disposed to face the substrate mounting surface 211.

The upper vessel 2021 has a flange 2021a and the insulation block 233 is mounted and secured on the flange 2021a. The insulation block 233 has a flange 233a, and the dispersion plate 234 is mounted and secured on the flange 233a. In addition, the lid 231 is secured to the upper surface of the insulation block 233. There is a high possibility that a gap (α) will be formed on the contact surface between the upper surface of the insulation block 233 and the lid 231 in terms of processing precision. Thus, an O-ring 236 configured to make the buffer space 232 airtight may be installed between the lid 231 and the insulation block 233.

With this structure, it is possible to remove, from above, the lid 231, the dispersion plate 234, and the insulation block 233 in this order.

Further, in this embodiment, since a plasma generator described below is connected to the lid 231, the insulation block 233 is installed to prevent power from transmitting to the upper vessel 2021. In addition, the dispersion plate 234 and the lid 231 are installed on the insulation block 233. However, the present disclosure is not limited thereto. For example, if there is no plasma generator, the dispersion plate 234 may be secured to the flange 2021a, and the lid 231 may be secured to a portion of the upper vessel 2021 other than the flange 2021a. That is, it may be any box structure where the lid 231 and the dispersion plate 234 are removed from above in this order. At this time, since there is a possibility that a gap will be formed between the lid 231 and the upper vessel 2021, the O-ring 236 may be installed between the lid 231 and the flange of the upper vessel 2021 to ensure airtightness.

A gas guide 235 configured to form the flow of a supplied gas is installed in the buffer space 232. The gas guide 235 may have a conical shape with a diameter increasing in a direction toward the dispersion plate 234 from the first dispersion mechanism 241 as the apex. The gas guide 235 is formed such that lower end portions thereof are positioned outside the through holes 234a formed at the outermost circumference of the dispersion plate 234. An upper end portion of the gas guide 235 may be fixed to the lid 231 with, e.g., a screw.

(Supply System)

The first dispersion mechanism 241 is connected to the gas through hole 231a that is installed in the lid 231 of the shower head 230. A common gas supply pipe 242 is connected to the first dispersion mechanism 241. A flange 241b is installed in the first dispersion mechanism 241. The flange is secured to the lid 231 by a screw or the like and is secured to a flange of the common gas supply pipe 242.

Since the interior of the first dispersion mechanism 241 is in communication with the interior of the common gas supply pipe 242, the gas supplied from the common gas supply pipe 242 is supplied into the shower head 230 through the first dispersion mechanism 241 and the gas through hole 231a.

A first gas supply pipe 243a, a second gas supply pipe 244a, and a third gas supply pipe 245a are connected to the common gas supply pipe 242. The second gas supply pipe 244a is connected to the common gas supply pipe 242 through a remote plasma generator 244e.

A first component-containing gas is mainly supplied from a first gas supply system 243 including the first gas supply pipe 243a. A second component-containing gas is mainly supplied from a second gas supply system 244 including the second gas supply pipe 244a. From a third gas supply system 245 including the third gas supply pipe 245a, an inert gas is mainly supplied when processing the wafer and a cleaning gas is mainly supplied when cleaning the shower head 230 or the process space 201.

(First Gas Supply System)

In the first gas supply pipe 243a, a first gas supply source 243b, a mass flow controller (MFC) 243c as a flow rate controller (flow rate control part), and a valve 243d as an opening/closing valve are installed in this order from an upstream side.

The first component-containing gas is supplied to the shower head 230 from the first gas supply pipe 243a through the mass flow controller 243c, the valve 243d, and the common gas supply pipe 242.

The first component-containing gas may be a precursor gas, that is, one of process gases. Here, the first component may be, for example, titanium (Ti) that is a metal-based component. That is, the first component-containing gas may be, for example, a titanium-containing gas. In addition, the first component-containing gas may be in any one of a solid, a liquid and a gas at a normal temperature and at a normal pressure. If the first component-containing gas is a liquid at a normal temperature and at a normal pressure, a vaporizer (not shown) may be installed between the first gas supply source 243b and the mass flow controller 243c. Here, the first component-containing gas will be described as a gas.

At a downstream side of the valve 243d, the first gas supply pipe 243a is connected to a downstream end of a first inert gas supply pipe 246a. In the first inert gas supply pipe 246a, an inert gas supply source 246b, a mass flow controller (MFC) 246c as a flow rate controller (flow rate control part), and a valve 246d as an opening/closing valve are installed in this order from an upstream side.

Here, the inert gas may be, for example, a nitrogen ($N_2$) gas. In addition, the inert gas may include, for example, a rare gas, such as a helium (He) gas, a neon (Ne) gas, and an argon (Ar) gas, in addition to a $N_2$ gas.

The first gas supply system 243 (also referred to a titanium-containing gas supply system) is mainly configured by the first gas supply pipe 243a, the mass flow controller 243c, and the valve 243d.

Further, a first inert gas supply system is mainly configured by the first inert gas supply pipe 246a, the mass flow controller 246c, and the valve 246d. In addition, the inert gas supply source 246b and the first gas supply pipe 243a may also be included in the first inert gas supply system.

Furthermore, the first gas supply source 243b and the first inert gas supply system may also be included in the first gas supply system 243.

(Second Gas Supply System)

The remote plasma generator 244e is installed at a downstream side of the second gas supply pipe 244a. In an upstream side of the second gas supply pipe 244a, a second gas supply source 244b, a mass flow controller (MFC) 244c as a flow rate controller (flow rate control part), and a valve 244d as an opening/closing valve are installed in this order from an upstream side.

The second component-containing gas is supplied into the shower head 230 from the second gas supply pipe 244a though the mass flow controller 244c, the valve 244d, the remote plasma generator 244e, and the common gas supply pipe 242. The second component-containing gas may be made into plasma by the remote plasma generator 244e and supplied onto the wafer 200.

The second component-containing gas is one of the process gases. In addition, the second component-containing gas may be considered as a reaction gas or a modifying gas.

Here, the second component-containing gas may contain a second component other than the first component. The second component may be, for example, any one of nitrogen (N) and carbon (C). In this embodiment, the second component-containing gas may be, for example, a nitrogen-containing gas. Specifically, an ammonia ($NH_3$) gas may be used as the nitrogen-containing gas.

The second gas supply system 244 (also referred to a nitrogen-containing gas supply system) is mainly configured by the second gas supply pipe 244a, the mass flow controller 244c, and the valve 244d.

In addition, at a downstream side of the valve 244d, the second gas supply pipe 244a is connected to a downstream end of a second inert gas supply pipe 247a. In the second inert gas supply pipe 247a, an inert gas supply source 247b, a mass flow controller (MFC) 247c as a flow rate controller (flow rate control part), and a valve 247d as an opening/closing valve are installed in this order from an upstream side.

An inert gas is supplied into the shower head 230 from the second inert gas supply pipe 247a through the mass flow controller 247c, the valve 247d, the second gas supply pipe 244a, and the remote plasma generator 244e. The inert gas may function as a carrier gas or a dilution gas in a thin film forming process S104.

A second inert gas supply system is mainly configured by the second inert gas supply pipe 247a, the mass flow controller 247c, and the valve 247d. In addition, the inert gas supply source 247b, the second gas supply pipe 244a, and the remote plasma generator 244e may also be included in the second inert gas supply system Further, the second gas supply source 244b, the remote plasma generator 244e, and the second inert gas supply system may also be included in the second gas supply system 244.

(Third Gas Supply System)

In the third gas supply pipe 245a, a third gas supply source 245b, a mass flow controller (MFC) 245c as a flow rate controller (flow rate control part), and a valve 245d as an opening/closing valve are installed in this order from an upstream side.

An inert gas as a purge gas is supplied to the shower head 230 from the third gas supply pipe 245a though the mass flow controller 245c, the valve 245d, and the common gas supply pipe 242.

Here, the inert gas may be, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The third gas supply system 245 is mainly configured by the third gas supply pipe 245a, the mass flow controller 245c, and the valve 245d.

Furthermore, the third gas supply source 245b may also be included in the third gas supply system 245.

In the substrate processing process, the inert gas supplied from the third gas supply source 245b may act as a purge gas with which the process vessel 202 or the shower head 230 having the gas collected therein are purged.

Figure 3:
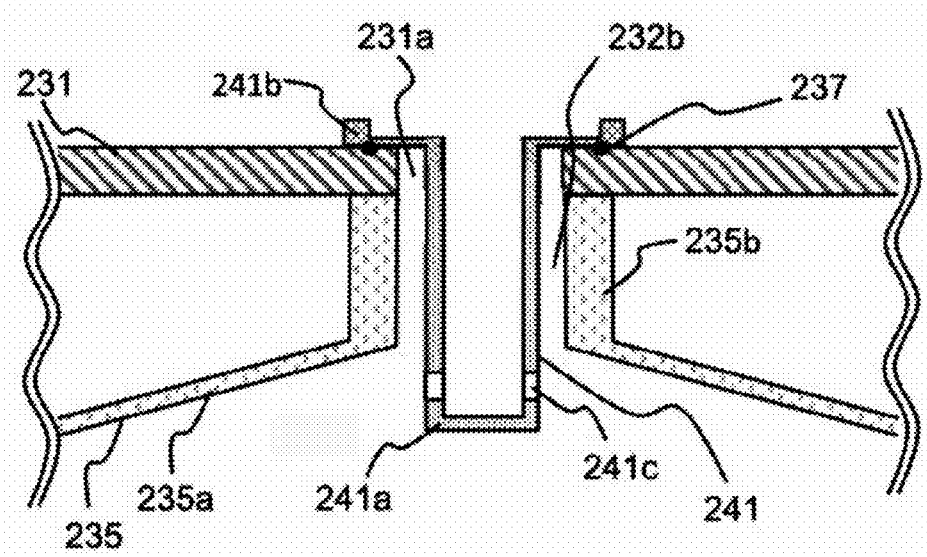
FIG. 3 is an explanatory view for explaining the relationship between a gas guide and the first dispersion mechanism according to the first embodiment.

Subsequently, with reference to FIG. 3, specific structures of the first dispersion mechanism 241, the gas guide 235, and the lid 231 will be described. FIG. 3 is an enlarged view of the periphery of the first dispersion mechanism 241 of FIG. 1 and is an explanatory view explaining the specific structures of the first dispersion mechanism 241, the gas guide 235, and the lid 231.

The first dispersion mechanism 241 includes the front end portion 241a and the flange 241b. The front end portion 241a is inserted from above the through hole 231a. A lower surface of the flange 241b is secured to an upper surface of the lid 231 by screws or the like. An upper surface of the flange 241b is secured to the flange of the gas supply pipe 242 by screws or the like. An O-ring 237 may be installed between the flange 241b and the lid 231 to make the space in the shower head airtight. It is possible to remove the first dispersion mechanism 241 separately from the lid 231. When removing it, the screws for securing to the gas supply pipe 242 or the screws for securing to the lid are detached to remove it from the lid 231.

The gas guide 235 includes a plate part 235a and a connecting part 235b.

The plate part 235a is plates that guide a gas supplied from the dispersion holes 241c of the first dispersion mechanism 241 to the dispersion plate 234 at the lower side. The plate part 235a has a conical shape with a diameter expanding toward the dispersion plate 234. The gas guide 235 has lower end portions that are positioned outside the through holes 234a at the most outer peripheral side of the dispersion plate 234.

The connecting part 235b is configured to connect the lid 231 and the plate part 235a. An upper end portion of the connecting part 235b is secured to the lid 231 by a screw or the like (not shown). A lower end portion thereof is connected to the plate part 235a by welding or the like. The connecting part 235b may have a cylinder shape and may be configured to surround the outer circumference of a side wall of the front end portion 241a with a gap 232b interposed therebetween. With the gap 232b, when the first dispersion mechanism 241 is removed from the lid 231, the first dispersion mechanism 241 may be prevented from coming physically contact with the connecting part 235b. By avoiding the physical contact, the removal of the first dispersion mechanism 241 is facilitated so that generation of particles caused by such physical contact is suppressed.

(Plasma Generation Part)

A matching unit 251 and a high frequency power source 252 are connected to the lid 231 of the shower head. By adjusting impedance with the high frequency power source 252 and the matching unit 251, plasma is generated in the shower head 230 and the process space 201.

(Exhaust System)

An exhaust system configured to exhaust the atmosphere of the process vessel 202 includes a plurality of exhaust pipes connected to the process vessel 202. Specifically, it includes an exhaust pipe 261 connected to the transfer space 203 (a fifth exhaust pipe), an exhaust pipe 262 connected to the buffer space 232 (a first exhaust pipe), and an exhaust pipe 263 connected to the process space 201 (a third exhaust pipe). In addition, an exhaust pipe 264 (a fourth exhaust pipe) is connected to a downstream side of each of the exhaust pipes 261, 262, and 263.

The exhaust pipe 261 may be connected to a side surface or a bottom surface of the transfer space 203. A TMP (Turbo Molecular Pump, a third vacuum pump) 265 as a vacuum pump realizing high vacuum or ultra-high vacuum is installed in the exhaust pipe 261. A valve 266 as a first exhaust valve for the transfer space is installed at an upstream side of the TMP 265 in the exhaust pipe 261.

Further, in the exhaust pipe 261, a valve 267 may be installed at the downstream side of the TMP 265. A cryotrap 268 may be installed as a capturing assembly configured to capture a residual cleaning solution described later between the valve 266 and the TMP 265 (a third vacuum pump) (first and second vacuum pumps will be described later). In addition, a bypass pipe 261b (second exhaust pipe) may be connected to the upstream side of the valve 266 in the exhaust pipe 261. A valve 269 may be installed in the bypass pipe 261b. A downstream side of the bypass pipe 261b may be connected to the exhaust pipe 264. Further, with respect to the bypass pipe 261b, the exhaust pipe 261 will be referred to as a main exhaust pipe 261a. Also, the main exhaust pipe 261a, the bypass pipe 261b, and valves and pumps installed in these pipes will be collectively referred to as a transfer space exhauster.

The exhaust pipe 262 may be connected to an upper surface or a side surface of the buffer space 232. A valve 270 is connected to the exhaust pipe 262. In the exhaust pipe 262, a bypass pipe 262b may be connected to an upstream side of the valve 270. In the bypass pipe 262b, a valve 271, a cryotrap 272, a TMP 273 (the first vacuum pump), and a valve 274 are installed in this order from the upstream side. The cryotrap 272 will be described later. The cryotrap 272 may be used as a capturing assembly configured to capture a residual cleaning solution or a cleaning chemical solution residue within the shower head. Also, with respect to the bypass pipe 262b, the exhaust pipe 262 will be referred to as a main exhaust pipe 262a. Also, the main exhaust pipe 262a, the bypass pipe 262b, and the valves and pumps installed in these pipes will be collectively referred to as a shower head exhauster.

The exhaust pipe 263 may be connected to a side of the process space 201. An APC (Auto Pressure Controller) 276, which is a pressure adjuster configured to control the interior of the process space 201 to a predetermined pressure, is installed in the exhaust pipe 263. The APC 276 may include a valve body (not shown) with adjustable opening level and may adjust the conductance of the exhaust pipe 263 according to instructions from a controller, which is described below. A valve 277 is installed at a downstream side of the APC 276 in the exhaust pipe 263. In addition, a valve 275 as a first valve for evacuation of the process space is installed at an upstream side of the APC 276 in the exhaust pipe 263. The exhaust pipe 263 and valves and pumps installed in that pipe are integrally referred to as a process space exhauster.

A DP (Dry Pump) (the second vacuum pump) 278 is installed in the exhaust pipe 264. The DP is a pump that can exhaust in a range of pressure higher than that of the TMP described above. As shown in the drawing, the exhaust pipe 262 (the main exhaust pipe 262a), the bypass pipe 262b, the exhaust pipe 263, the exhaust pipe 261 (the main exhaust pipe 261a), and the bypass pipe 261b are connected to the exhaust pipe 264 in this order from an upstream side and the DP 278 is installed at the downstream side of them. The DP 278 is configured to exhaust the atmosphere of each of the buffer space 232, the process space 201, and the transfer space 203 through the exhaust pipe 262, the exhaust pipe 263, the exhaust pipe 261, the bypass pipe 261b and the bypass pipe 262b, respectively. In addition, when the TMP 265 operates, the DP 278 may also function as an auxiliary pump thereof. Since it is difficult for the TMP 265, as a high vacuum (or ultra-high vacuum) pump, to perform by itself the exhaust to atmospheric pressure, the DP 278 may be used as the auxiliary pump to perform the exhaust to atmospheric pressure. In each valve of the exhaust system described above, for example, an air valve may be used.

(Controller)

The substrate processing apparatus 100 includes a controller 280 configured to control the operations of respective parts of the substrate processing apparatus 100. The controller 280 includes at least a computing unit 281 and a memory device 282. The controller 280 is connected to the respective configurations described above, and is configured to invoke a program or a recipe from the memory device 282 and control the operations of the respective configurations according to instructions from a higher controller or a user. Moreover, the controller 280 may be configured as a dedicated computer or may be configured as a general-purpose computer. For example, the controller 280 according to this embodiment may be configured by preparing an external memory device 283 (for example, a magnetic tape, a magnetic disc such as a flexible disc or a hard disc, an optical disc such as a CD or DVD, a magneto-optical disc such as an MO, a semiconductor memory such as a USB memory (USB Flash Drive) or a memory card, in which the program is stored, and installing the program on the general-purpose computer through the external memory device 283. Also, a means for supplying the program to the computer is not limited to the external memory device 283. For example, the program may be supplied using communication means such as an Internet or a dedicated line, rather than through the external memory device 283. Also, the memory device 282 or the external memory device 283 may be configured as a non-transitory computer-readable recording medium. Hereinafter, these will be simply referred to as a "recording medium." In addition, when the term "recording medium" is used herein, it may indicate only the memory device 282, only the external memory device 283, or both the memory device 282 and the external memory device 283.

<Substrate Processing Process>

Next, a process of forming a thin film on the wafer 200 using the substrate processing apparatus 100 will be described. Further, in the following descriptions, operations of respective parts of the substrate processing apparatus 100 are controlled by the controller 280.

Figure 4:
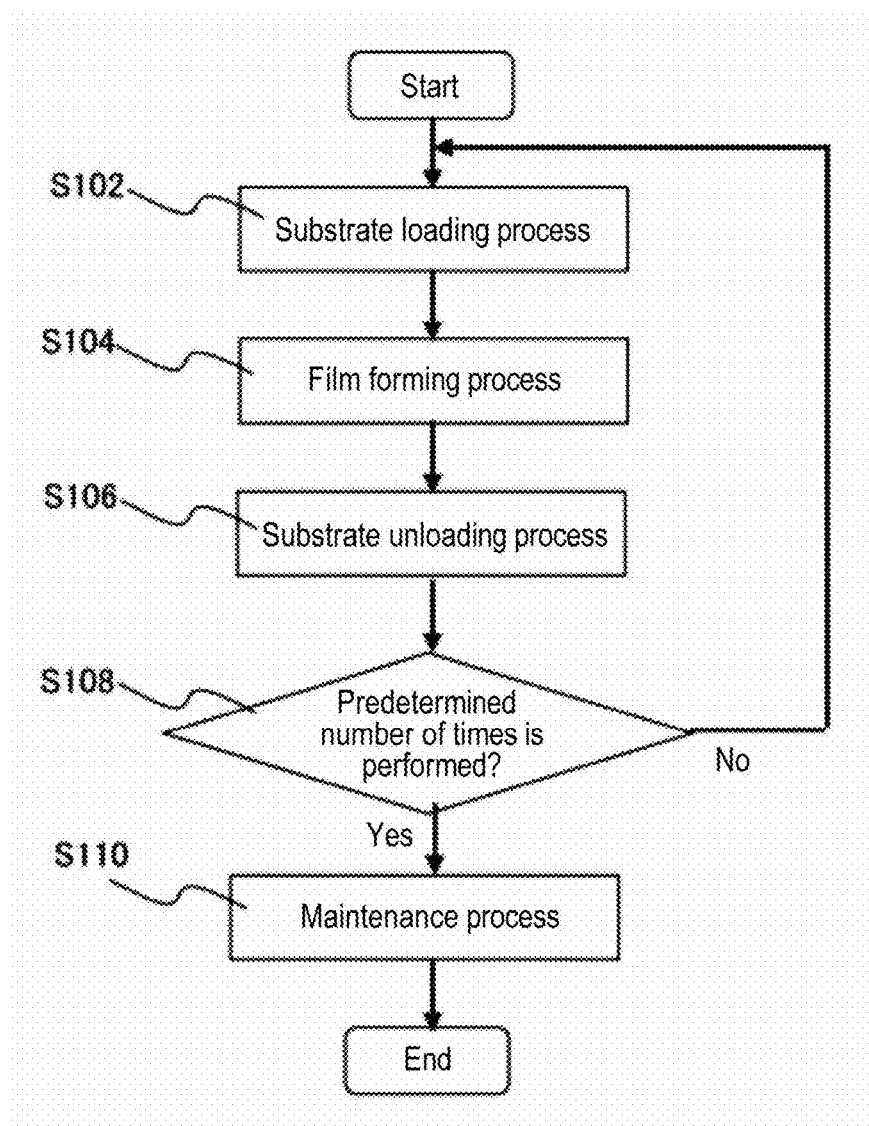
FIG. 4 is a flowchart illustrating a substrate processing process of the substrate processing apparatus shown in FIG. 1.
Figure 5:
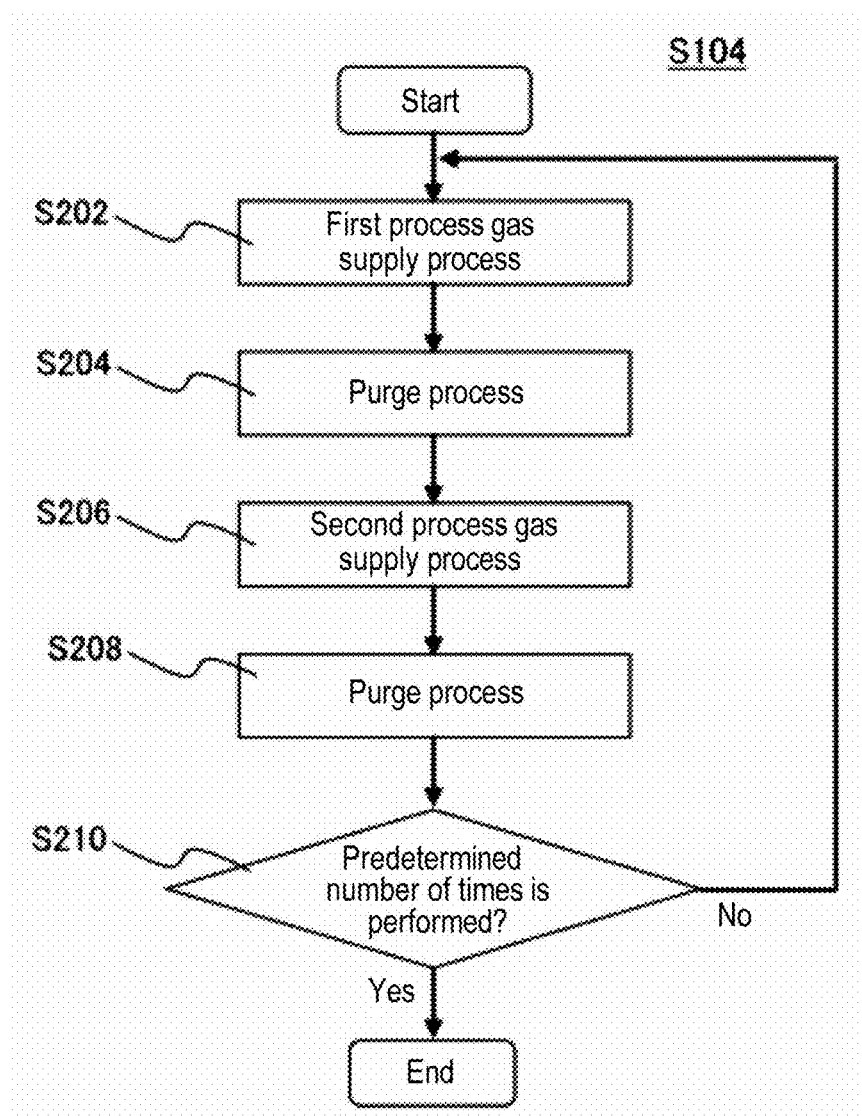
FIG. 5 is a flowchart illustrating the details of a film forming process shown in FIG. 4.
Figure 6:
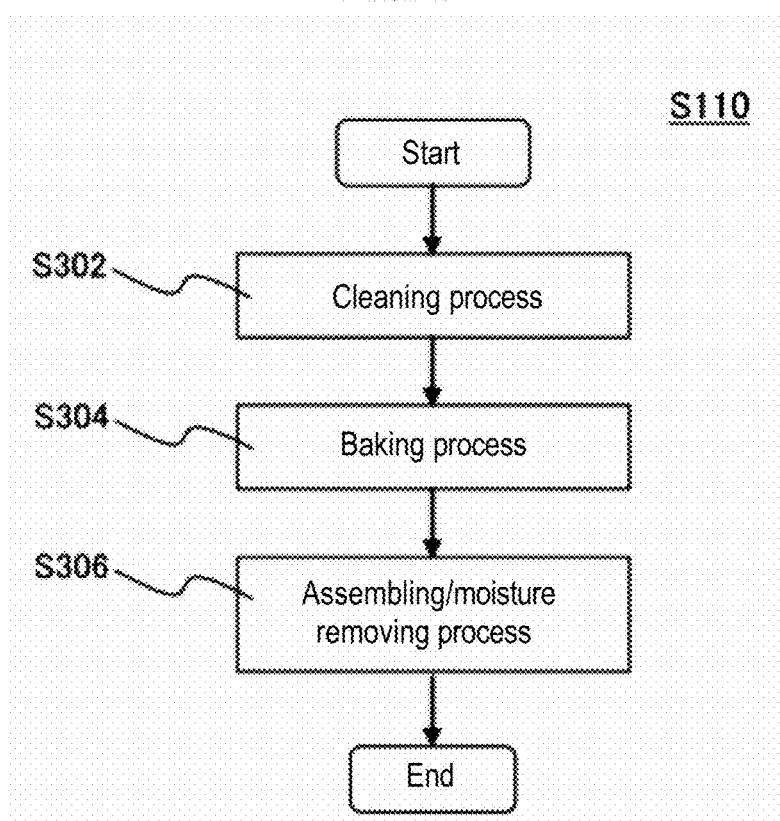
FIG. 6 is a view illustrating the details of a maintenance process shown in FIG. 4.
Figure 7:
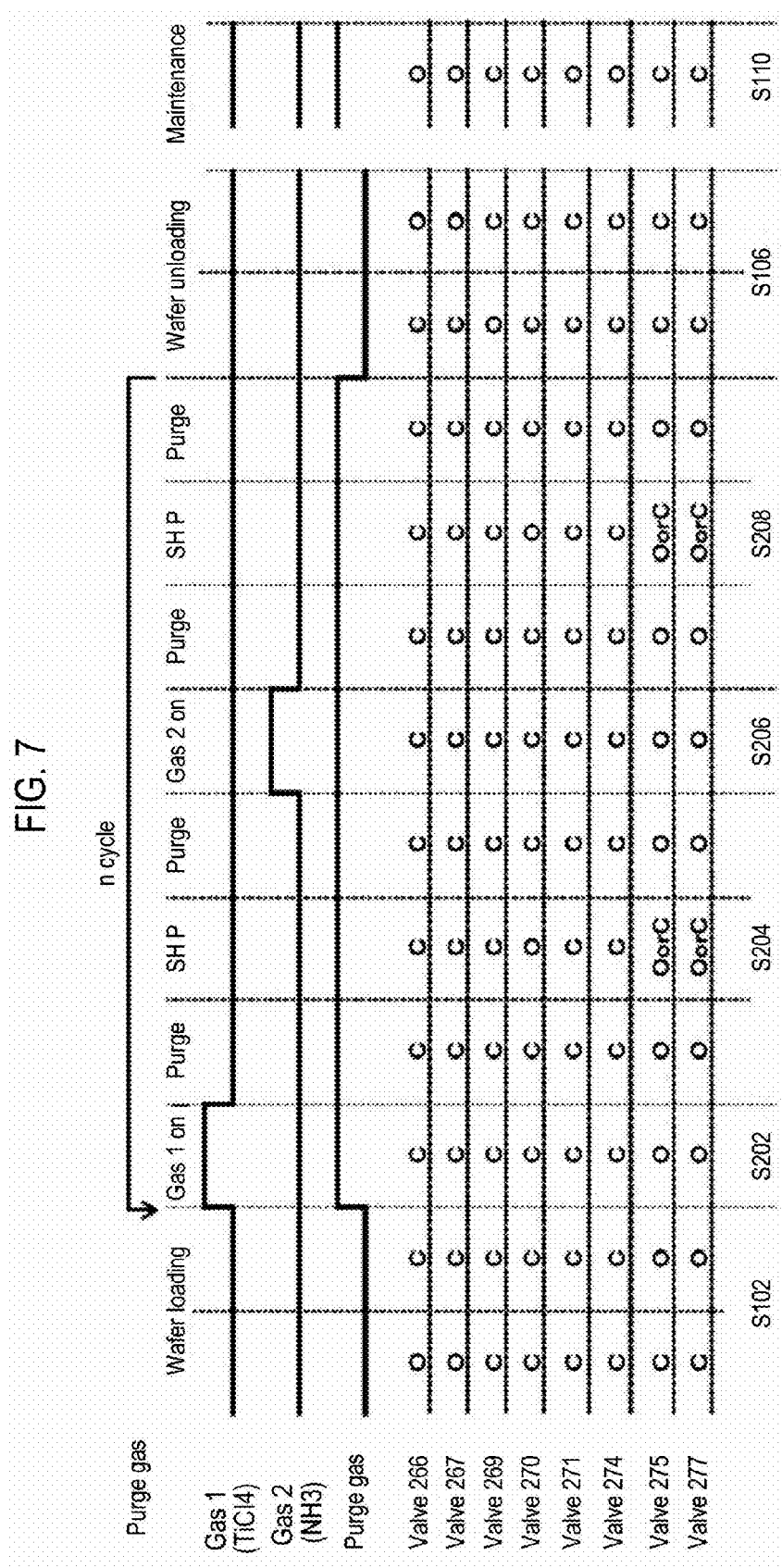
FIG. 7 is a sequence diagram illustrating an operation of an exhaust system of the substrate processing apparatus shown in FIG. 1.

FIG. 4 is a flowchart illustrating a substrate processing process according to this embodiment. FIG. 5 is a flowchart illustrating the details of a film forming process (S104) shown in FIG. 4. Further, FIG. 6 is a flowchart illustrating the details of a maintenance process (S110) of FIG. 4. FIG. 7 is a sequence diagram illustrating opening and closing of a valve of the exhaust system in each process. In FIG. 7, "O" denotes a valve opening and "C" denotes a valve closing.

Here, an example in which a titanium nitride film is formed on the wafer 200 with a TiCl$_4$ gas as a first process gas and an ammonia (NH$_3$) gas as a second process gas will be described.

(Substrate Loading·Mounting Process S102)

In the substrate processing apparatus 100, the substrate mounting stand 212 is lowered down to the transfer position of the wafer 200 so that the through holes 214 of the substrate mounting stand 212 are penetrated by the lift pins 207. As a result, the lift pins 207 are in a state where they protrude from the surface of the substrate mounting stand 212 by a predetermined height. Next, the gate valve 205 is opened, thereby allowing the transfer space 203 to be in communication with the transfer chamber (not shown). Then, the wafer 200 is loaded into the transfer space 203 from the transfer chamber by using a wafer transfer device (not shown). The wafer 200 is transferred onto the lift pins 207. Accordingly, the wafer 200 is supported in a horizontal position above the lift pins 207 that protrude from the surface of the substrate mounting stand 212.

When the wafer 200 is loaded into the process vessel 202, the wafer transfer device is evacuated outside of the process vessel 202 and the gate valve 205 is closed to make the interior of the process vessel 202 airtight. Then, the substrate mounting stand 212 is raised up so that the wafer 200 is mounted on the substrate mounting surface 211 provided on the substrate mounting stand 212 and subsequently raised up to the processing position in the process space 201 described above.

Operations of respective valves of the exhaust system in the substrate loading-mounting process (S102) will be described with reference to FIG. 7. First, when the wafer 200 is loaded into the process vessel 202, the valves 266 and 267 are opened (valve opening) to allow the transfer space 203 and the TMP 265 to communicate and also allow the TMP 265 and the DP 278 to communicate. Meanwhile, the valves of the exhaust system other than the valves 266 and 267 are closed (valve closing). Thus, the atmosphere of the transfer space 203 is evacuated by the TMP 265 (and the DP 278), making the process vessel 202 to reach a high vacuum (ultra-high vacuum) state (e.g., $10^{-5}$ Pa or less). The reason for making the process vessel 202 reach the high vacuum (ultra-high vacuum) state during this process is to reduce a pressure difference from the transfer chamber maintained in the high vacuum (ultra-high vacuum) state (e.g., equal to or lower than $10^{-6}$ Pa). In this state, the gate valve 205 is opened and the wafer 200 is loaded from the transfer chamber to the transfer space 203. Further, the TMP 265 and the DP 278 keep operating during the processes of FIGS. 4 and 5 such that the delay of the processing process entailed in an operation startup thereof is not generated.

When the wafer 200 is loaded to the transfer space 203 and raised up to the processing position in the process space 201, the valves 266 and 267 are closed. Accordingly, a space between the transfer space 203 and the TMP 265 and a space between the TMP 265 and the exhaust pipe 264 are blocked so that the exhausting the transfer space 203 by the TMP 265 is stopped. Meanwhile, the valves 277 and 275 are opened, thereby allowing the process space 201 to be in communication with the APC 276 and also allowing the APC 276 to be in communication with the DP 278. The APC 276 adjusts the conductance of the exhaust pipe 263, thereby controlling the exhaust flow rate of the process space 201 by the DP 278 to maintain the process space 201 to a predetermined pressure (for example, a high vacuum of $10^{-5}$ to $10^{-1}$ Pa). Further, the other valves of the exhaust system are kept closed. In addition, when the valves 266 and 267 are closed, the valve 266 positioned in the upstream side of the TMP 265 is closed and the valve 267 is subsequently closed, thereby stably maintaining the operation of the TMP 265.

Moreover, in this process, while the interior of the process vessel 202 is being exhausted, a $N_2$ gas as an inert gas may be supplied from the inert gas supply system into the process vessel 202. In addition, while the interior of the process vessel 202 is exhausted with the TMP 265 or the DP 278, at least the valve 245d of the third gas supply system may be opened so that the $N_2$ gas is supplied into the process vessel 202.

In addition, when the wafer 200 is mounted on the substrate mounting stand 212, power is supplied to the heater 213 buried inside the substrate mounting stand 212 so that the surface of the wafer 200 is controlled to reach a predetermined temperature. The temperature of the wafer 200 may be, for example, within a range of room temperature to 500 degrees C., and preferably, a range of room temperature to 400 degrees C. At this time, the temperature of the heater 213 may be adjusted by controlling a power on/off state for the heater 213 based on temperature information detected by a temperature sensor (not shown).

(Film Forming Process S104)

Next, the thin film forming process S104 is performed. Hereinafter, with reference to FIG. 5, the film forming process S104 will be described in detail. Further, the film forming process S104 is a cyclic process of repeatedly supplying different process gases by turns.

(First Process Gas Supply Process S202)

If the wafer 200 is heated to reach a desired temperature, the valve 243d may be opened and concurrently the mass flow controller 243c may be adjusted so that the flow rate of the $TiCl_4$ gas is set to a predetermined flow rate. The supply flow rate of the $TiCl_4$ gas may be, for example, within a range of 100 sccm to 5000 sccm. At this time, the valve 245d of the third gas supply system may be opened to supply a $N_2$ gas from the third gas supply pipe 245a. The $N_2$ gas may also flow from the first inert gas supply system. In this case, the supply of the $N_2$ gas from the third gas supply pipe 245a may be started beforehand.

The $TiCl_4$ gas supplied to the process vessel 202 is supplied onto the wafer 200. The $TiCl_4$ gas contacts the wafer 200 to form a titanium-containing layer as "the first component-containing layer" on the surface of the wafer 200.

The titanium-containing layer may be formed to have a certain thickness and a certain distribution, according to, for example, a pressure inside the process vessel 202, a flow rate of the $TiCl_4$ gas, a temperature of the substrate mounting stand 212, and the time taken to pass the process space 201. Further, the wafer 200 may have a certain film previously formed thereon. In addition, there may be a certain pattern previously formed on the wafer 200 or the certain film thereon.

After a predetermined time has passed from the starting of the supply of the $TiCl_4$ gas, the valve 243d may be closed to stop the supply of the $TiCl_4$ gas. In the process S202 described above, as explained above with reference to FIG. 7, the valves 275 and 277 are opened so that the pressure of the process space 201 is controlled to a predetermined pressure by the APC 276. In S202, the valves of the exhaust system other than the valves 275 and 277 are all closed.

(Purge Process S204)

Next, a $N_2$ gas is supplied from the third gas supply pipe 245a to purge the shower head 230 and the process space 201. Here, the valves 275 and 277 are still opened so that the pressure of the process space 201 is controlled to a predetermined pressure by the APC 276. Meanwhile, the valves of the exhaust system other than the valves 275 and 277 are all closed. Accordingly, the $TiCl_4$ gas that could not combine with the wafer 200 in the first process gas supply process S202 is removed from the process space 201 through the exhaust pipe 263 by the DP 278.

Next, a $N_2$ gas is supplied from the third gas supply pipe 245a to purge the shower head 230. As for the exhaust valves at this time, as shown in "SH P" of FIG. 7, while the valves 275 and 277 are closed, the valve 270 is opened. The other valves of the exhaust system remain in a closed state. That is, when purging the shower head 230, the space between the process space 201 and the APC 276 is blocked and concurrently the space between the APC 276 and the exhaust pipe 264 is blocked to stop the pressure control by the APC 276 and to allow the buffer space 232 to be in communication with the DP 278. Accordingly, the $TiCl_4$ gas remaining in the shower head 230 (the buffer space 232) is exhausted from the shower head 230 through the exhaust pipe 262 by the DP 278. At this time, the valve 277 at the downstream side of the APC 276 may be opened.

When completing the purge of the shower head 230, the valves 277 and 275 are opened to resume the pressure control by the APC 276. Concurrently, the valve 270 is closed to block the space between the shower head 230 and the exhaust pipe 264. The other valves of the exhaust system remain in a closed state. At this time, the supply of the $N_2$ gas from the third gas supply pipe 245a may continue so that the purge of the shower head 230 and the process space 201 continues. In the purge process S204 of this embodiment, the purge through the exhaust pipe 263 is performed before and after the purge through the exhaust pipe 262. Alternatively, however, only the purge through the exhaust pipe 262 may be performed. In addition, the purge through the exhaust pipe 262 and the purge through the exhaust pipe 263 may be performed at the same time.

(Second Process Gas Supply Process S206)

After the purge process S204, the valve 244d is opened to start the supply of an ammonia gas in a plasma state into the process space 201 through the remote plasma generator 244e and the shower head 230.

At this time, the mass flow controller 244c is adjusted such that the flow rate of the ammonia gas is set to a predetermined flow rate. In addition, the supply flow rate of the ammonia gas may be, for example, within a range of 100 sccm to 5000 sccm. Further, along with the ammonia gas, a $N_2$ gas as a carrier gas may flow from the second inert gas supply system. In addition, in this process, the valve 245d of the third gas supply system may be also opened to supply the $N_2$ gas from the third gas supply pipe 245a.

The ammonia gas in a plasma state is supplied onto the wafer 200. The titanium-containing layer already formed on the wafer 200 may be modified by the plasma of the ammonia gas so that a layer containing, for example, a titanium component and a nitrogen component, is formed on the wafer 200.

The modified layer may be formed to have a certain thickness, a certain distribution, and a certain penetration depth of the nitrogen component to the titanium-containing layer, depending on, for example, a pressure in the process vessel 202, a flow rate of the nitrogen-containing gas, a temperature of the substrate mounting stand 212, and a power supply state of the remote plasma generator 244e.

After a predetermined time has passed, the valve 244d is closed to stop the supply of the nitrogen gas.

In S206, similarly to S202 described above, the valves 275 and 277 are opened so that the pressure of the process space 201 is controlled to a predetermined pressure by the APC 276. In addition, the valves of the exhaust system other than the valves 275 and 277 are all closed.

(Purge Process S208)

Next, a purge process that is identical to S204 is performed. As the operations of respective parts are identical to S204, the descriptions are omitted.

(Determination S210)

The controller 280 determines whether the first process gas supply process (S202) to the purge process (S208) is performed a predetermined number of times (n cycle).)

If it is determined that the cycle has not been performed a predetermined number of times ("NO" in S210), the cycle of the first process gas supply process S202, the purge process S204, the second process gas supply process S206, and the purge process S208 is repeated. If the cycle is performed a predetermined number of times ("YES" in S210), the processing shown in FIG. 5 is terminated.

Returning to the descriptions of FIG. 4, subsequently, a substrate unloading process S106 is performed.

(Substrate Unloading Process S106)

In the substrate unloading process S106, the substrate mounting stand 212 is lowered down to have the wafer 200 supported on the lift pins 207 that protrude from the surface of the substrate mounting stand 212. Accordingly, the wafer 200 is located in the transfer position from the processing position. Then, the gate valve 205 is opened and the wafer 200 is unloaded to the outside of the process vessel 202 using the wafer transfer device. At this time, the valve 245d is closed and the supply of the inert gas into the process vessel 202 from the third gas supply system is stopped.

Operations of respective valves of the exhaust system during the substrate unloading process (S106) are as shown in FIG. 7. First, while the wafer 200 is moving from a process position to the transfer position, the valves 275 and 277 are closed to stop the pressure control by the APC 276. Meanwhile, the valves 266 and 267 are opened to allow the transfer space 203 and the DP 279 to communicate and the transfer space 203 is evacuated by the DP 278. At this time, the other valves of the exhaust system are closed When the wafer 200 is moved to the transfer position, the valve 262 is closed to block the space between the transfer space 203 and the exhaust pipe 264. Meanwhile, the valves 266 and 267 are opened to exhaust the atmosphere of the transfer space 203 by the TMP 265 (and the DP 278). Thus, the process vessel 202 is maintained in a high vacuum (ultra-high vacuum) state (for example $10^{-5}$ Pa or less) so that a pressure difference with the transfer chamber, which is also maintained in a high vacuum (ultra-high vacuum) state (for example $10^{-6}$ Pa or less), is reduced. In this state, the gate valve 205 is opened to unload the wafer 200 from the process vessel 202 to the transfer chamber.

(Processing Times Determination Process S108)

After the wafer 200 is unloaded, it is determined whether the thin film forming process has been performed a predetermined number of times. If it is determined that the thin film forming process has been performed the predetermined number of times, the flow proceeds to a maintenance process (S110). If it is determined that the thin film forming process has not been performed the predetermined number of times, the processing proceeds to the substrate loading-mounting process S102 in order to start processing of the next waiting wafer 200.

(Maintenance Process (S110))

Next, a maintenance process is performed. Hereinafter, the details of the maintenance process will be described with reference to FIG. 6.

(Cleaning Process (S302))

When it is determined that the thin film forming process has been performed a predetermined number of times in the processing times determination process (S108), a maintenance process is performed. In the maintenance process, the apparatus is disassembled and each component is cleaned with a cleaning solution. As the cleaning solution, for example, a fluorine-containing cleaning solution, pure water, or alcohol such as ethanol may be used. The fluorine-containing cleaning solution is useful for a quartz component. Further, in case of a metal-based component, a cleaning solution that does not corrode a metal, such as pure water or alcohol is used.

When it is determined that the thin film forming process has been performed a predetermined number of times in the process times determination process (S108), each valve is closed to completely stop gas supplies and to stop the operations of the pumps excluding the DP 278. Thereafter, the apparatus is disassembled.

In this embodiment, first, the first dispersion mechanism 241 is removed from the common gas supply pipe 242 and the lid 231. Next, the lid 231 and the gas guide 235 are removed from the insulating block 233. Further, the dispersion plate 234 is lifted up to be removed.

Each of the lid 231, the insulating block 233, and the dispersion plate 234 is immersed in a cleaning solution so that a cleaning target is removed therefrom.

(Baking Process (S304))

When the cleaning target is removed, the cleaning solution visible to naked eyes are blown away through blowing of air or $N_2$. Then, each component is baked by using a heater for a baking process different from the present apparatus to allow the cleaning solution to be evacuated to a degree. In this embodiment, in order to further reduce a down time, the baking process is performed for a short period of time, compared with a general baking process.

(Assembling/Residual Cleaning Solution Removing Process (S306))

When the cleaning solution is removed to a degree in the baking process, an assembling operation of inserting the dispersion plate 234, the insulating block 233, and the lid 231 is performed in this order from above.

In this embodiment, since the time for the baking process is shortened in order to seek a reduction in the down time, there is a high possibility that the cleaning solution will remain in each component. Thus, it may be considered that a residual cleaning solution is accumulated in, e.g., the gap 232b, the gap ($\alpha$), or the like, in the shower head 230 after assembling.

If the film forming process is performed, for example, when a film having no oxygen component is formed, in a state where the residual cleaning solution is accumulated, the following problems may arise. A first problem is that, during the first process gas supply process (S202), a residual cleaning solution containing a component different from the process gas, such as oxygen or fluorine, is mixed with a titanium-containing gas within the shower head 230 and the mixture adheres to the metal-containing layer to accelerate oxidation of the metal-containing layer. Since the amount of the mixed residual cleaning solution is small, an oxidized portion and non-oxidized portion coexist on the surface of the substrate (stained state), degrading a yield.

Another problem is that the film including the oxidized metal-containing layer in the first process gas supply process (S202) may have an unintentional resistance value, and as a result, the resistance value of the formed film itself may beyond a desired range.

Still another problem is that, since an uncontrolled amount of hydrogen or oxygen adheres to the metal-containing layer, a portion to which the oxygen component adheres and a portion without the oxygen component have different film component distributions or film density, degrading in-plane uniformity of the film characteristics.

Yet another problem is that, since the residual cleaning solution is gradually removed whenever the film forming process is performed, a substrate that is processed immediately after assembling and a substrate that is processed after a few number of processes for substrates may have different amounts of the adhered oxygen component. Thus, film characteristics of substrates processed per lot become different.

Meanwhile, with respect to the configuration of the apparatus, which exhaust system is to be used to exhaust a residual component within the shower head 230 needs to be discussed. If the residual component is exhausted from the exhaust pipe connected to the process space 201 or the transfer space 203, the residual component should be exhausted through the through holes 234a. Here, since the exhaust conductance of the through holes 234a is small, it takes a long time for exhausting the residual component.

Thus, in this embodiment, the exhaust system connected to the shower head 230 is used to remove the residual cleaning solution. Further, the residual cleaning solution capturing assembly is installed in the exhaust system of the shower head 230 in order to remove the residual cleaning solution in the shower head.

In order to remove the residual cleaning solution as described above, specifically, the following operation is performed in this process.

In a state in which a wafer 200 is not loaded in the process space 201, the valve 267, the valve 269, the valve 270, the valve 274, and the valve 275 are closed and the process chamber is opened to atmosphere. Next, the valve 274 is opened to perform vacuumization to reach a predetermined pressure by the DP 278. After the vacuumization is completed, the TMP 273 is actuated. When the TMP becomes to normally rotate, the cryotrap 272 is actuated and keeps operating. The cryotrap 272 keeps operating until a predetermined temperature (absolute temperature: about 200K) is reached as described later.

The shower head 230 and the like may be assembled in parallel with the driving operations until the cryotrap 272 is actuated. When it is checked that the assembling of the process chamber including the shower head is completed, the valve 270 is opened and the valve 274 is closed to make the process chamber vacuumized to reach a predetermined pressure by the DP 278. When the process chamber reaches the predetermined pressure, the valve 271 is opened.

Here, a method of cooling the cryotrap 272 will be described. The cryotrap 272 may have a dedicated compressor. In order to cool the cryotrap 272, a helium (He) gas may be supplied to the dedicated compressor and compressed, and the compressed He gas may be rapidly exhausted. In this manner, a cryopanel (cooling panel) may be cooled with a heat removing effect of the He gas. This operation may be repeated at a high speed to cool the cryotrap 272 to the absolute temperature of about 200K. The He gas having heat exhausted from the cooler of the cryotrap is returned to the dedicated compressor. The heat of the He gas is removed with a coolant oil circulating within the dedicated compressor. Then, the He gas is compressed again and supplied to the cryotrap.

The residual cleaning solution or the like in the air intaken by the TMP 273 is adsorbed to the surface of the cooled cryopanel as described above.

Further, while the cryotrap 272 is used as the capturing assembly in this embodiment, if a higher speed exhaust needs to be performed or if in the interior of the process chamber needs to be highly vacuumized, a cryopump may be used, instead of the combination of the cryotrap and the TMP.

However, it may be considered that the cryopump may lengthen a down time due to the following reasons. First, the cryopump has the properties of being cooled to an extreme low temperature lower than that of the cryotrap. Thus, with the cryopump, a condensation range may be increased to extend capture-available components. However, it takes time to cool the cryopump. Further, the extreme low temperature may refer to, e.g., 15K or less. In addition, the cryopump is based on a cooling scheme using a storage pump, and thus, it is necessary to supply a nitrogen ($N_2$) gas into the pump to rapidly return an internal temperature of the cryopump to a room temperature to perform a regeneration process. Thus, a maintenance operation of the cryopump may be greater than that of the cryotrap. Furthermore, there is a possibility that the residual nitrogen component may flow backward to the interior of the process chamber.

Meanwhile, the amount of molecules that can be captured by the cryotrap is limited, compared with the cryopump. However, but the cyrotrap does not need to be cooled to the extreme low temperature. Thus, the cryotrap may be cooled to a desired temperature within a short time, compared with the cryopump. Further, in the regeneration process, after the valve at the upstream side is closed, the cryotrap is stopped and returned to the room temperature, and the TMP is exhausted to perform regeneration. In addition, since a nitrogen gas is not supplied, there is no need to consider a residual nitrogen component.

Thus, if a short down time has priority or if an influence of a nitrogen component is concerned, a combination of the cryotrap and the TMP is used.

Moreover, in this embodiment, while the two TMPs (TMP 265 and TMP 273) are used and described, the present disclosure is not limited thereto and, for example, a TMP may be commonly used.

Further, while the residual component capturing process is performed in this process after the apparatus is assembled, the present disclosure is not limited thereto. For example, a concentration of a residual component or the like is detected, and when the concentration is equal to or greater than a critical value, the residual component capturing process may be performed. In this case, a down time may be controlled with higher efficiency.

In addition, in this embodiment, while $TiCl_4$ is described as the first element-containing gas by way of example, the present disclosure is not limited thereto. For example, a material containing a metal element, such as Zr or Hf, or the like, on which an oxygen component negatively influences, may be used.

While film forming technologies have been described above as various exemplary embodiments of the present disclosure, the present disclosure is not limited to those embodiments. For example, the present disclosure can be applied to a film forming processing of other than a thin film that is exemplified above, or to other substrate processing such as a diffusion processing, a nitriding processing, a lithography processing or the like. In addition, the present disclosure can be applied to other substrate processing apparatus, such as, a thin film formation apparatus, an etching apparatus, a nitriding processing apparatus, a coating apparatus, a heating apparatus, and the like, in addition to an annealing treatment device. Further, it is possible to substitute a part of the configuration of an embodiment with the configuration of another embodiment, and also, it is possible to add the configuration of another embodiment to the configuration of a certain embodiment. In addition, for a part of the configuration of each embodiment, it is also possible to add, delete, or substitute other configurations.

<Aspects of the Present Disclosure>

Hereinafter, some aspects of the present disclosure will be additionally stated as supplementary notes.

(Supplementary Note 1)

A substrate processing apparatus, including:

a shower head configured to disperse a gas;

a process vessel installed at a downstream side of the shower head and configured to have a process space in which a substrate is processed by a process gas;

a gas supplier connected to the shower head;

a shower head gas exhauster connected to the shower head; and a capturing assembly configured to capture a component different from the process gas within the shower head.

(Supplementary Note 2)

The apparatus of Supplementary Note 1, wherein the capturing assembly is installed in the shower head gas exhauster.

(Supplementary Note 3)

The apparatus of Supplementary Note 1 or 2, wherein the shower head gas exhauster includes, a first exhaust pipe having a first valve for exhausting the shower head, and a second exhaust pipe connected to the first exhaust pipe at an upstream side of the first valve for exhausting the shower head, the second exhaust pipe having a second valve for exhausting the shower head and the capturing assembly installed in this order from an upstream side.

(Supplementary Note 4)

The apparatus of any one of Supplementary Notes 1 to 3, wherein the process space is connected to a process space exhauster, the process space exhauster having a third exhaust pipe with a first valve for exhausting the process space.

(Supplementary Note 5)

The apparatus of any one of Supplementary Notes 1 to 4, wherein the shower head includes a lid in which a gas guide is installed, and a dispersion assembly configured to disperse a supplied gas.

(Supplementary Note 6)

The apparatus of Supplementary Note 3, wherein a first vacuum pump is installed at a downstream side of the capturing assembly in the second exhaust pipe.

(Supplementary Note 7)

The apparatus of any one of Supplementary Notes 3 to 6, wherein a common exhaust pipe is connected to downstream sides of the first exhaust pipe and the second exhaust pipe, and wherein a second vacuum pump that exhausts in a range of a pressure higher than a pressure of the first vacuum pump is connected to the common exhaust pipe.

(Supplementary Note 8)

The apparatus of any one of Supplementary Notes 1 to 7, wherein the gas supplier includes a precursor gas supply system configured to supply a precursor gas, a reaction gas supply system configured to supply a reaction gas that reacts with the precursor gas, and an inert gas supply system configured to supply an inert gas.

(Supplementary Note 9)

The apparatus of Supplementary Note 3, further including:

a controller configured to control each of the apparatus, wherein the controller is configured to control operations of a film forming process, wherein the film forming process includes a precursor gas supply process of evacuating air from the exhauster for the process space while supplying a precursor gas, with a substrate in the process space; a reaction gas supply process of evacuating air from the exhauster for the process space while supplying a reaction gas; and a shower head exhaust process of, between the precursor gas supply process and the reaction gas supply process, evacuating air of the shower head, in a state in which a first valve for exhausting the shower head is opened and the second valve for exhausting the shower head is closed, and wherein the controller is further configured to control operations of a capturing process of capturing the component different from the process gas, by closing the first valve for exhausting the shower head and opening the second valve for exhausting the shower head, with no substrate in the process space.

(Supplementary Note 10)

The apparatus of Supplementary Note 9, wherein the controller is configured to control actuation of the capturing assembly during the capturing process.

(Supplementary Note 11)

A method of manufacturing a semiconductor device that processes a substrate by supplying a gas dispersed through a shower head to a process space, the method including:

processing the substrate by supplying a process gas dispersed through the shower head to the process space;

unloading the substrate from the process space; and capturing a component different from the process gas within the shower head.

(Supplementary Note 12)

A program which causes a computer to execute a method of manufacturing a semiconductor device that processes a substrate by supplying a gas dispersed through a shower head to a process space, the method including:

processing the substrate by supplying a process gas dispersed through the shower head to the process space;

unloading the substrate from the process space; and capturing a component different from the process gas within the shower head.

(Supplementary Note 13)

A non-transitory computer-readable recording medium storing a program which causes a computer to execute a method of manufacturing a semiconductor device that processes a substrate by supplying a gas dispersed through a shower head to a process space, the method including:

processing the substrate by supplying a process gas dispersed through the shower head to the process space;

unloading the substrate from the process space; and capturing a component different from the process gas within the shower head.

(Supplementary Note 14)

A method of manufacturing a semiconductor device that processes a substrate by supplying a gas dispersed through a shower head at an upstream side of a process space to the process space, the method including:

loading the substrate into the process space;

performing a film forming process on the substrate by evacuating air from the process space by means of allowing a first valve for exhausting the shower head to be opened and simultaneously a second valve for exhausting the shower head to be closed, while supplying a gas from the shower head, the first valve being installed in a first exhaust pipe connected to the shower head, and the second valve being installed in a second exhaust pipe;

unloading the substrate from the process space; and actuating a capturing assembly installed at a downstream side of the second valve for exhausting while allowing the second valve for exhausting the shower head to be opened, in a state in which the first valve for exhausting the shower head is closed.

(Supplementary Note 15)

A program which causes a computer to execute a method of manufacturing a semiconductor device that processes a substrate by supplying a gas dispersed through a shower head at an upstream side of a process space to the process space, the method including:

loading the substrate into the process space;

performing a film forming process on the substrate by supplying a gas through the shower head;

unloading the substrate from the process space; and actuating a capturing assembly installed in a shower head exhauster, with no substrate in the process space.

(Supplementary Note 16)

A non-transitory computer-readable recording medium storing a program which causes a computer to execute a method of manufacturing a semiconductor device that processes a substrate by supplying a gas dispersed through a shower head at an upstream side of a process space to the process space, the method including:

loading the substrate into the process space;

processing a film formation on the substrate by supplying a gas through the shower head;

unloading the substrate from the process space; and actuating a capturing assembly installed in a shower head exhauster, with no substrate in the process space.

(Supplementary Note 17)

A method of manufacturing a semiconductor device that processes a substrate by supplying a gas dispersed through a shower head at an upstream side of a process space to the process space, the method including:

processing the substrate by supplying a gas dispersed through the shower head to the process space;

unloading the substrate from the process space; and disassembling the substrate processing apparatus and cleaning it with a cleaning chemical solution; and capturing a residual component of the cleaning chemical solution that remains in the shower head after assembling the substrate processing apparatus.

According to the present disclosure in some embodiments, it is possible to have a high efficiency of capturing a component different from a process gas within a shower head.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:

a shower head configured to disperse a gas;

a process vessel installed at a downstream side of the shower head and configured to have a process space in which a substrate is processed by a process gas;

a gas supplier connected to the shower head;

a capturing assembly, including either a combination of a cryotrap and a vacuum pump or a cryopump;

a shower head gas exhauster, wherein the shower head gas exhauster includes:

a first exhaust pipe with a first valve for exhausting the shower head, the first exhaust pipe being connected to the shower head; and a second exhaust pipe, one end of the second exhaust pipe being connected to a portion of the first exhaust pipe between the shower head and the first valve, wherein, in the second exhaust pipe, a second valve for exhausting the shower head and the capturing assembly are installed in this order from an upstream side of the shower head; and a controller configured to:

in a film forming process being performed with respect to the substrate in the process space, control the substrate processing apparatus to process the substrate by supplying the process gas from the gas supplier to the processing space; and in a cleaning solution removal process after a wet-cleaning of the shower head, the cleaning solution removal process being performed with respect to no substrate in the process space, control the vacuum pump or the cryopump to capture a component different from the process gas, among residual components of the cleaning solution in the wet-cleaning, by closing the first valve and opening the second valve.

2. The apparatus of claim 1, wherein the shower head comprises a lid in which a gas guide is installed, and a dispersion plate configured to disperse a supplied gas.

3. The apparatus of claim 2, wherein the gas supplier comprises a precursor gas supply system configured to supply a precursor gas, a reaction gas supply system configured to supply a reaction gas that reacts with the precursor gas, and an inert gas supply system configured to supply an inert gas.

4. The apparatus of claim 1, wherein the process space is connected to a process space exhauster, the process space exhauster having a third exhaust pipe with a third valve for exhausting the process space.

5. The apparatus of claim 1, wherein a common exhaust pipe is connected to downstream sides of the first exhaust pipe and the second exhaust pipe, and wherein a second vacuum pump that can exhaust in a range of a pressure higher than a pressure of the vacuum pump is connected to the common exhaust pipe.

6. The apparatus of claim 4, wherein the gas supplier comprises a precursor gas supply system configured to supply a precursor gas, a reaction gas supply system configured to supply a reaction gas that reacts with the precursor gas, and an inert gas supply system configured to supply an inert gas.

7. The apparatus of claim 6,
wherein the film forming process includes a precursor gas supply process of evacuating air from the process space exhauster while supplying a precursor gas; a reaction gas supply process of evacuating air from the process space exhauster while supplying the reaction gas; and a shower head exhaust process of, between the precursor gas supply process and the reaction gas supply process, evacuating air from the shower head, in a state in which the first valve for exhausting the shower head is opened and the second valve for exhausting the shower head is closed.

* * * * *